United States Patent [19]

Young et al.

[11] Patent Number: 4,474,828

[45] Date of Patent: Oct. 2, 1984

[54] METHOD OF CONTROLLING THE SUPERCURRENT OF A JOSEPHSON JUNCTION DEVICE

[75] Inventors: Peter L. Young, North Wales; Richard M. Josephs, Willow Grove; John A. Coleman, Warrington, all of Pa.

[73] Assignee: Sperry Corporation, New York, N.Y.

[21] Appl. No.: 480,523

[22] Filed: Mar. 30, 1983

[51] Int. Cl.$^3$ .................... H01L 39/22; H01L 39/24
[52] U.S. Cl. ........................................ 427/38; 427/63; 427/126.3; 427/282; 427/255.4; 204/164
[58] Field of Search ............... 427/38, 39, 63, 126.3, 427/255.4, 282; 204/164

[56] References Cited

U.S. PATENT DOCUMENTS

| | | | |
|---|---|---|---|
| 3,814,983 | 6/1974 | Weissfloch et al. | 204/164 |
| 3,875,068 | 4/1975 | Mitzel | 204/164 |
| 4,232,057 | 11/1980 | Ray et al. | 204/164 |

OTHER PUBLICATIONS

Broom et al., IBM J. Res. Develop., vol. 24, No. 2, Mar. 1980, pp. 206–211.

Donaldson et al., IEEE Transactions on Electron Devices, vol. ED-27, No. 10, Oct. 1980, pp. 1988–1997.
Greiner et al., IBM J. Res. Develop., vol. 24, No. 2, Mar. 1980, pp. 195–205.
Havemann et al., J. Vac. Sci. Technol. 15 (2), Mar.-/Apr. 1978, pp. 392–395.

Primary Examiner—Norman Morgenstern
Assistant Examiner—Richard Bueker
Attorney, Agent, or Firm—John B. Sowell; Thomas J. Scott; Marshall M. Truex

[57] ABSTRACT

A novel method of depositing the oxide barrier junction on a base electrode of a Josephson junction device is provided. An ionized oxygen plasma region is generated juxtaposed the surface of the base electrode to be oxidized. The pressure of the oxygen in the vacuum chamber is held at a predetermined high pressure where the zero voltage supercurrent is found to be independent of oxygen pressure variations and the flow of oxygen through the vacuum chamber is stabilized at the optimum minimum necessary for growth of the oxide barrier junction. The oxide barrier junctions so produced have consistent and predictable supercurrent densities.

7 Claims, 4 Drawing Figures

METHOD OF CONTROLLING THE SUPERCURRENT OF A JOSEPHSON JUNCTION DEVICE

BACKGROUND OF THE INVENTION

1. Field of the Invention

This invention relates to a novel method of forming an oxide barrier junction for Josephson junction devices. More particularly, the present invention relates to a method of making oxide barrier junctions for Josephson junction devices which have uniform superconducting current characteristics.

2. Description of the Prior Art

Josephson junction devices are currently being produced which comprise base electrodes and counter electrodes of superconducting materials. The superconducting material electrodes are separated by an insulation layer. The insulation layer is provided with a plurality of small windows or apertures where the electrode materials are only separated by a very thin junction barrier oxide layer having a thickness of approximately 50 angstmoms. When a current is applied that exceeds the critical current of the Josephson junction device, the oxide barrier layer will present a high impedance to the flow of current. Before this critical current level is reached, the Josephson junction device exhibits no measurable resistance. In order to incorporate such Josephson junction devices into logic circuitry, it is important that each of the devices having the same area oxide barrier junction be capable of switching or reaching the critical current level at the same value. In the present state of the art, it is required that the zero voltage supercurrent of different devices in a logic circuit be within plus or minus ten percent of each other to provide adequate operating margins so that a plurality of devices can be driven in logic sequence.

The present state of the manufacturing art of Josephson junction devices does not permit the manufacture of a large number of Josephson junction devices in a logic circuit without selecting individual discrete devices. Thus, it is extremely difficult or practically impossible to make integrated circuits which embody a large number of Josephson junction devices.

It is known that the thickness of the oxide junction barrier layer determines the magnitude of the zero voltage supercurrent. It is generally assumed that the thickness of the oxide is controlled solely by the cathode self-biasing voltage (CSBV) and the oxygen pressure that is maintained in the vacuum system during growth of the oxide barrier layer.

The most widely used method of forming the oxide junction barrier layer is to grow the oxide layer in the presence of a plasma glow discharge. The plasma region may be produced opposite the substrate being processed by employing radio frequency (RF) energy between the substrate work holder and an anode which may be positioned juxtaposed the substrate.

The oxygen in the region between the anode and the substrate work holder is ionized by the RF energy which causes an oxide layer to form and grow on the exposed area of the base electrode IBM researchers have reported in the IBM Journal of Research and Development at Vol. 24, No. 2 (March, 1980) at pages 195 to 205 (see FIG. 4) that the zero voltage supercurrent of the oxide junction barrier depends only on the cathode self-biasing voltage and the pressure of the oxygen in the vacuum system. This IBM article reports that for a lead-indium-gold base electrode that the zero voltage superconducting current (I) is inversely proportional to the third power of the oxygen pressure ($1/p^3$).

Researchers at the National Bureau of Standards have reported in the Journal of Vacuum Science and Technology at Vol. 15, No. 2 (March/April, 1978) at pages 392 to 395 (see FIG. 3) that the zero voltage supercurrent (I) for lead base electrodes is inversely proportional to the 4.3 power of the oxygen pressure ($1/p^{4.3}$).

IBM researchers have also reported in the IEEE Transactions on Electron Devices, Vol. ED27, No. 10 (October, 1980) at pages 1998–2008 (see FIG. 8) that the zero voltage supercurrent (I) for niobium base electrodes is inversely proportional to the 7.06 power of the oxygen pressure ($1/p^{7.06}$).

Heretofore, none of the methods explained in the above-mentioned articles have been able to be employed to make devices on large wafers or substrates in which the zero voltage supercurrent of the Josephson junction devices consistently remains within the required limits of plus or minus ten percent.

All of the above prior art articles are concerned with determining the exponential factor of the oxygen pressure during the ion (plasma) growth of the oxide barrier junction layer.

The present inventors have observed that the pressure of the oxygen and the cathode self-biasing voltage is indeed a factor but is insufficient in predicting the thickness of the oxide barrier junction layer. Consequently, it does not offer predictability in determining the zero voltage supercurrent. Initially, the rate of oxide growth at the barrier junction is very rapid as the ions bombard the surface of the base electrode. As the oxide layer completely covers the exposed surface of the base electrode being oxidized, the depth or thickness of the oxide layer continues more slowly as the ions must penetrate into the layer being oxidized. It was observed that the ions bombarding the surface being oxidized were causing the depth of the oxide layer to increase but the ions were also causing atoms of oxygen at the surface of the oxide layer to be dislodged. This process of building up the oxide layer was found to continue until the loss of surface atoms balanced the depth of penetration of the ions which cause the oxide growth to become stabilized. Thus, there are two processes going on simultaneously until the thickness of the oxide layer stabilizes.

It was further observed that in the case of lead-indium alloys and niobium that more than one oxide of the material being oxidized was being created and that the chemical composition of the oxide barrier layer being formed was too complex to be analyzed and explained with balanced chemical equation analysis.

Heretofore, it was not fully known what variables other than the pressure and voltage were effecting the zero voltage supercurrent.

It would be desirable to provide a method of making oxide barrier junction layers for Josephson junction devices on base electrodes which eliminates the deviations in the zero voltage supercurrent which have occurred in the prior art processes.

SUMMARY OF THE INVENTION

It is a primary object of the present invention to provide a method of producing an oxide barrier junction layer on base electrode materials of Josephson junction devices which have precise zero voltage supercurrent density.

It is another object of the present invention to provide a novel method of producing oxide barrier junction layers on base electrode materials of Josephson junction devices which are substantially independent of oxygen pressure.

It is yet another object of the present invention to provide a novel method of producing oxide barrier junction layers on base electrode materials of Josephson junction devices which have the same thickness oxide layers.

It is yet another object of the present invention to provide a method of producing an oxide barrier junction layer on base electrode materials of Josephson junction devices which have reproducible complex oxide compositions that have reproducible zero voltage supercurrent density.

According to these and other objects of the present invention to be explained in greater detail hereinafter, there is provided in a vacuum system a substrate on which a barrier oxide layer is to be formed. The vacuum system is pumped down and then pure oxygen is bled into the system while the inlet of the vacuum pump is throttled down so that the flow of oxygen into the vacuum chamber is optimized at a very low level. An ionized oxygen plasma region is generated at the surface of the substrate being processed so that ions of pure oxygen bombard the surface of the base electrode to be oxidized. The pressure of the oxygen in the vacuum system is held in a predetermined region where the zero voltage supercurrent is independent of the oxygen pressure while also maintaining the optimum minimum flow of oxygen through the vacuum system.

DESCRIPTION OF THE PREFERRED EMBODIMENT

Before explaining the preferred embodiment, the novel results achieved will be better understood if a theory of operation which causes this novel result is understood. It is believed that the oxygen being introduced into the vacuum system is being ionized at a region away from the inlet and the outlet of the vacuum system so that the amount of oxygen ions impinging on the substrate are affected by the flow of the oxygen. It is further believed that when the flow of oxygen into the vacuum system is substantially increased to cause a discernable flow at the surface of the substrate that the low velocity ions are affected by this flow. When the low velocity ions are so affected to cause oblique incidence and impact on the base electrode, the number of ion particles that penetrate into the base electrode are diminished. A combination of these two phenomena definitely effect the chemical composition of the complex oxides being formed. Thus, contrary to all prior art theory, it has been established that the flow rate of the pure oxygen in the ionized area juxtaposed the substrate is the principal factor affecting the critical current and not the pressure of the oxygen as was heretofore proposed.

Figure 1:
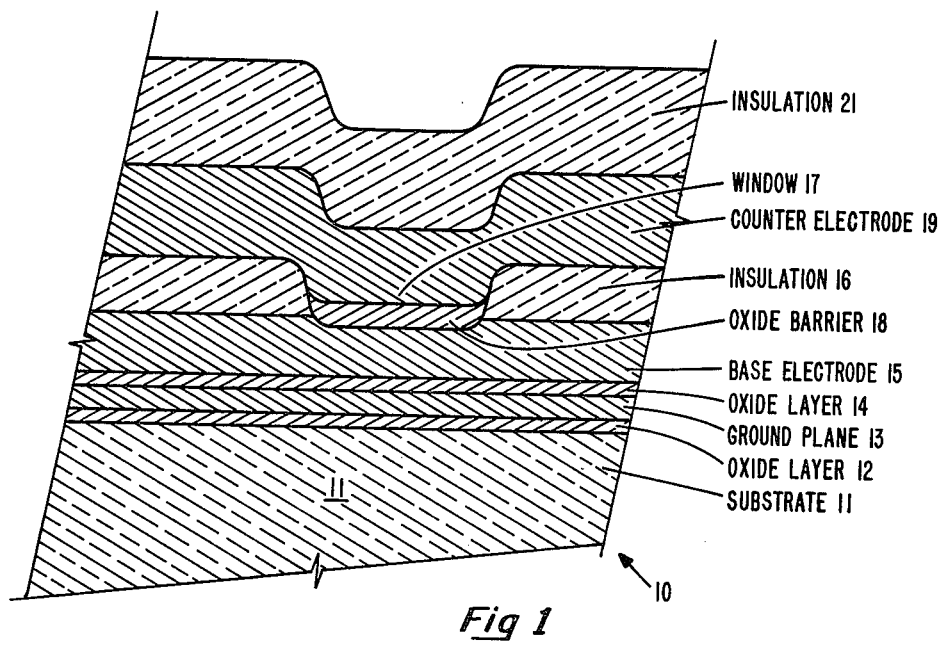
FIG. 1 is an enlarged section in elevation taken through one of a plurality of typical Josephson junction devices formed on a wafer according to the present invention.

Refer now to FIG. 1 showing a typical Josephson junction device of the type having an oxide barrier junction which may be made by the present invention process. The device 10 comprises a substrate 11 having a resistive oxide layer 12 form thereon. The first deposited layer shown is a ground plane 13 which may be deposited of niobium or other suitable metal. The next layer is an oxide layer 14 which is employed to isolate the ground plane from the base electrode 15. After the base electrode is formed, an insulation layer 16 is formed thereon having windows 17 or apertures through which the novel oxide barrier junction 18 will be formed. The process of forming this novel oxide barrier junction will be explained in detail hereinafter. After forming this junction 18, a counter electrode layer 19 is formed over the oxide barrier junction 18. After completing the counter electrode 19, an insulation layer 21 is employed to seal and protect the Josephson junction device which basically comprises base and counter electrodes having an oxide barrier junction formed therebetween. It will be understood that the base electrode 15 may be deposited directly on the substrate 11 when the ground plane is not required for circuit configurations.

Figure 2:
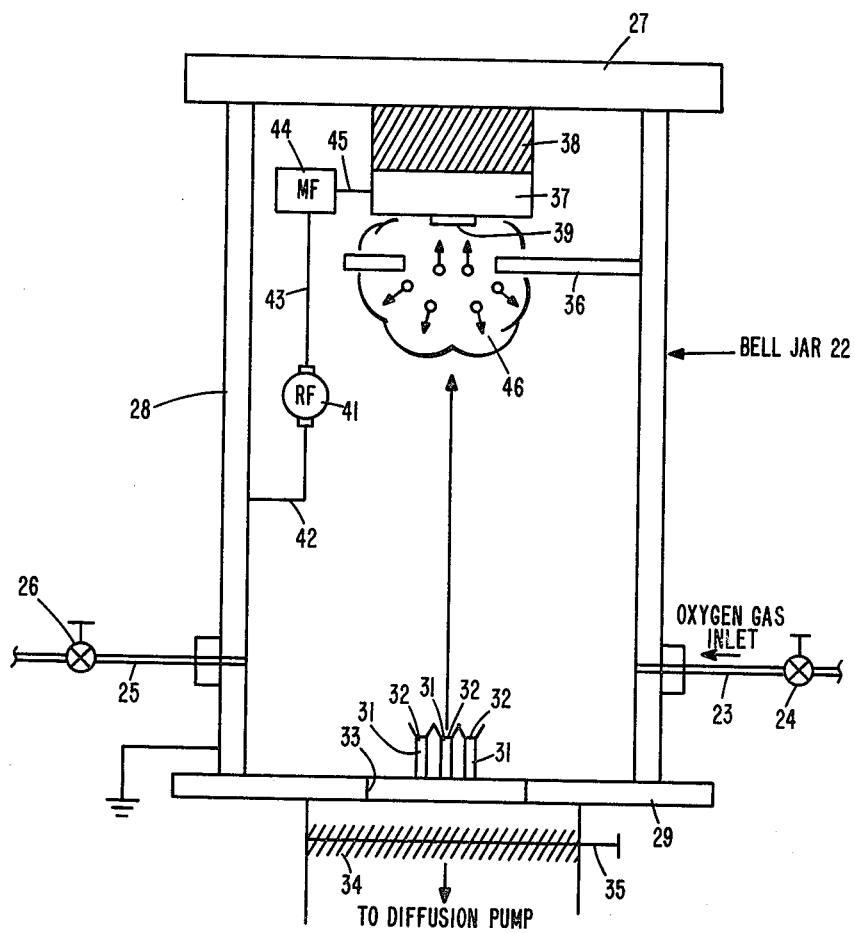
FIG. 2 is a schematic drawing view of a vacuum bell jar system of the type used to deposit and grow the novel oxide barrier junction.

Refer now to FIG. 2 showing a typical prior art bell jar system. The bell jar 22 is shown having an oxygen gas inlet 23 which is controlled by control valve 24. A second gas inlet 25 is shown having a control valve 26 which may be employed for other steps in manufacturing the Josephson junction device. The bell jar 22 comprises a top 27 and a cylindrical sidewall 28 which are supported on the base or platform 29. Boats 31 having material 32 therein to be evaporated are supported on a grate over the aperture 33 in the base 29. A diffusion pump (not shown) is employed to pull a vacuum in the bell jar 22 and the rate of operation of the diffusion pump may be controlled by the variable orifice 34 and control 35. Material 32 evaporated at boats 31 is deposited in a line of sight operation through shutter 36 which is attached to the sidewall 28. Work holder 37 is shown supported on an insulating support 38 and forms a support for substrate 39. A radio frequency energy source 41 is electrically connected to the sidewall 28 via line 42 and is also connected to the work holder 37 via line 43, matching network filter 44 in line 45. The radio frequency source is applied to the work holder 37 to generate a region 46 which forms a cloud of ionized gas. The ionized oxygen atoms induce a cathode self-biasing voltage on the work holder 37. As explained hereinbefore, if there was no flow of pure oxygen inside the vacuum system, the motion of the ionized atoms of oxygen in the region 46 would be essentially random. However, due to the flow of oxygen through the cloud of atoms, there is a tendency for the ionized atoms of oxygen to be swept toward the diffusion pump. It is the sweeping action which has been found to affect the zero voltage supercurrent (critical current) which now can be controlled by the novel process which permits the critical current of the barrier junction to be made substantially independent of the oxygen gas pressure.

In the preferred embodiment method, it is desired to introduce pure oxygen through control valve 24 at a minimal optimum amount. In order to achieve this minimal optimum value, the pressure of the pure oxygen in the bell jar is substantially reduced by restricting the outlet control valve 34, 35 in the conduit connected to the diffusion pump (not shown).

Figure 3:
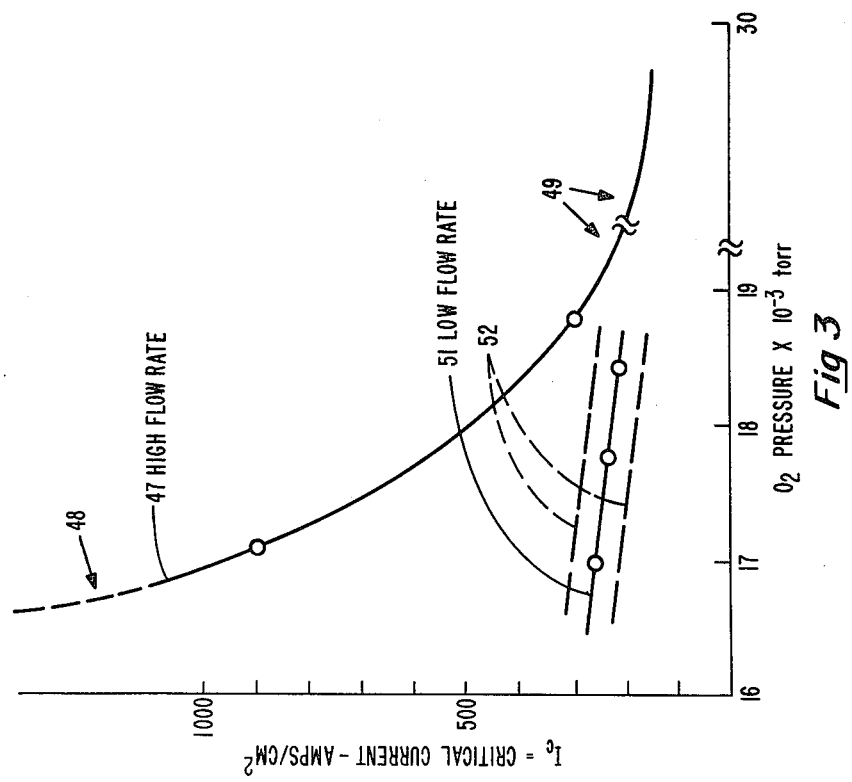
FIG. 3 is a curve of critical current versus oxygen pressure showing the desirable effects achieved at different flow rates.

Refer now to FIG. 3 which is a curve showing the critical current which is achieved at various oxygen pressures and showing the effects of the flow rate of oxygen through the system. It should be understood that the physical dimensions and location of the work holder, etc. inside of the vacuum chamber system can well affect the optimum and desired flow rate. Accordingly, to achieve the novel and desirable results achieved by the applicants, it is desirable to create a curve similar to the curve shown in FIG. 3 for each vacuum system being employed. Curve 47 was obtained while employing a high flow rate. In the system employed for obtaining this data, the high flow rate was achieved at one hundred forty five standard cubic centimeters per minute. It will be noted that the upper portion 48 of curve 47 shows that the critical current is inversely proportional to the oxygen pressure as was observed by the research reports discussed hereinbefore. However, the lower proportion 49 of the curve 47 shows that the critical current is not substantially affected by a change in oxygen pressure. Curve 51 verifies this observation and shows that the critical current ($I_c$) can be made substantially independent of the oxygen pressure by employing a low flow rate. In the system employed in the present invention a flow rate of twenty nine standard cubic centimeters per minute was found to be an optimum value for maintaining the critical current in a consistent and desirable range. The phantom lines 52 are employed to show the maximum standard deviation that would be expected under normal conditions of deposition of the oxide layer. It will be understood that the low flow rate curve 51 is not the only curve which may be employed to obtain consistent and repeatable current densities.

Figure 4:
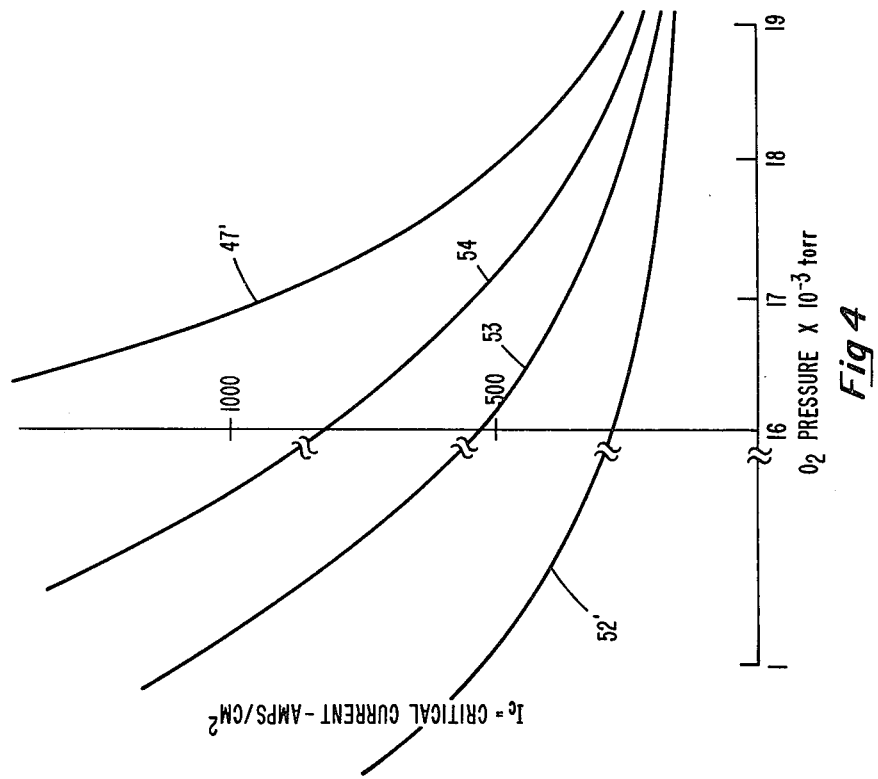
FIG. 4 shows a plurality of curves of critical current versus oxygen pressure employing extrapolated data to more clearly explain the present invention.

Refer now to FIG. 4 which shows an extrapolation of data and a family of curves illustrating that the critical current density may be made at a range of different oxygen pressures and within a range of different flow rates. The upper-most curve 47' is at the highest flow rate tested in the present system and shows that the upper-most portion of this curve is substantially vertical. The lowest curve 52' is indicative of the lowest flow rate tested and shows that there are a plurality of desirable oxygen pressure regions in which the oxide barrier junction layer 18 may be formed. Intermediate flow rate curves 53 and 54 illustrate that the desired critical current density may be predetermined by test data so as to achieve both predictable and desirable critical currents. It will be understood that it is desirable to maintain the critical current of all Josephson junction devices in the same logic circuit at the same critical current density so as to achieve a desirable operating margin when employing a sequence of logical operations with a plurality of Josephson junction devices in a circuit.

Refer now to both FIGS. 3 and 4 showing data achieved in a typical vacuum system approximately twenty-two inches high and twenty inches in internal diameter. The outlet for the vacuum pump is located below the base of the vacuum system and the oxygen inlets were connected through the side of the wall 28. In the system employed, the vacuum inlet line 23 was located closer to the bottom of the bell jar than the top of the bell jar 22 where the substrate 39 and cathode work holder 37 were located. This suggests that locating the oxygen gas inlet closer to the substrate and cathode work holder may permit lower oxygen pressures than those achieved using the vacuum system employed to achieve the present invention data. When the pure oxygen pressure is maintained between $5 \times 10^{-3}$ torr and $30 \times 10^{-3}$ torr, a complete range of flow rate curves was achieved. By simultaneously regulating and reducing the flow employing the inlet control valve 24 and the outlet throttle control valve 35, the flow of oxygen into the vacuum chamber was optimized. The most desirable flow was achieved at approximately twenty-nine standard cubic centimeters per minute and the extrapolated curve data indicates that an optimum flow under fifty standard cubic centimeters per minute down to about nine standard cubic centimeters per minute will achieve consistent critical current.

Having explained a preferred embodiment of the present invention, those skilled in the operation of vacuum systems to produce Josephson junction devices will be able to employ the present invention to conduct a series of tests in which the minimum pure oxygen flow compatible with consistent results is recorded at an optimum range of flow rates achieved without regard to a fixed or critical oxygen pressure.

What is claimed is:

1. A method of making oxide barrier junctions for Josephson junction devices which have uniform superconducting current characteristics substantially independent of oxygen pressure, comprising the steps of:

providing a vacuum chamber having an inlet control valve and an outlet throttle control valve, providing a substrate, providing a masked pattern on a base electrode formed on said substrate, supporting said substrate on a cathode work holder in said vacuum chamber, providing an anode opposite said substrate on said work holder, providing a radio frequency power source coupled between said anode and said cathode work holder, providing a high vacuum in said vacuum chamber, introducing into said vacuum chamber substantially pure oxygen through said inlet control valve, regulating said inlet control valve and said outlet throttle control valve until a stabilized pure oxygen atmosphere having a pressure between $5 \times 10^{-3}$ and $30 \times 10^{-3}$ torr is achieved, regulating said inlet control valve and said outlet throttle control valve until the flow of oxygen into said vacuum chamber is optimized below 50 cubic centimeters per minute, generating an ionized plasma region juxtaposed said substrate at said cathode work holder by applying radio frequency power thereto, oxidizing said base electrode by oxygen ion bombardment to form an oxide barrier on the area of said base electrode which is not covered by said mask to form a homogeneous and consistent barrier junction which has reproducible and consistent current characteristics, and wherein said step of regulating said inlet control valve and said outlet throttle control valve further comprises the step of changing the pressure of the pure oxygen in said vacuum chamber until the zero voltage supercurrent of said oxide barrier being formed becomes substantially unchanged over a range of oxygen pressures.

2. A method of making oxide barrier junctions as set forth in claim 1 wherein said zero voltage supercurrent deviates substantially less than 20% over the range of oxygen pressures being employed for growing said oxide barrier junction layer.

3. A method of making oxide barrier junctions as set forth in claim 2 wherein said zero voltage supercurrent remains constant within plus or minus 10% of the optimum value.

4. A method of making oxide barrier junctions as set forth in claim 1 wherein said step of regulating said inlet control valve and said outlet throttle control valve further includes maintaining a stabilized flow of oxygen into said vacuum chamber in a range between 9 and 39 cubic centimeters per minute.

5. A method of making oxide barrier junctions for Josephson junction devices as set forth in claim 1 wherein said flow of oxygen into said vacuum chamber is optimized at approximately 29 cubic centimeters per minute.

6. A method of making oxide barrier junctions as set forth in claim 5 wherein said pure oxygen atmosphere pressure is maintained constant in a range between 16 and $20 \times 10^{-3}$ torr.

7. A method of making oxide barrier junctions as set forth in claim 5 wherein said pure oxygen atmosphere pressure is stabilized and maintained at approximately $18 \times 10^{-3}$ torr.

* * * * *